(12) United States Patent
Xie

(10) Patent No.: US 6,572,985 B2
(45) Date of Patent: Jun. 3, 2003

(54) ELECTROLUMINESCENT COMPOSITIONS AND DEVICES

(75) Inventor: Shuang Xie, Richmond (CA)

(73) Assignee: Shuang Xie Light Corporation, Vancouver (CA)

( * ) Notice: Subject to any disclaimer, the term of this patent is extended or adjusted under 35 U.S.C. 154(b) by 32 days.

(21) Appl. No.: 09/736,234

(22) Filed: Dec. 15, 2000

(65) Prior Publication Data

US 2003/0031893 A1 Feb. 13, 2003

(51) Int. Cl.$^7$ ............................................... H05B 33/14
(52) U.S. Cl. ..................... 428/690; 428/704; 428/917; 257/40; 257/103; 313/504; 313/506; 252/301.16; 252/301.35
(58) Field of Search ................................ 428/690, 704, 428/913; 313/504, 506; 252/301.16, 301.35; 257/40, 103; 564/426, 431, 433, 434

(56) References Cited

U.S. PATENT DOCUMENTS

| | | |
|---|---|---|
| 3,530,325 A | 9/1970 | Mehl et al. |
| 4,356,429 A | 10/1982 | Tang |
| 4,539,507 A | 9/1985 | VanSlyke et al. |
| 4,720,432 A | 1/1988 | VanSlyke et al. |
| 4,769,292 A | 9/1988 | Tang et al. |
| 4,950,950 A | 8/1990 | Perry et al. |
| 5,150,006 A | 9/1992 | Van Slyke et al. |
| 5,256,945 A | 10/1993 | Imai et al. |
| 5,374,489 A | 12/1994 | Imai et al. |
| 5,487,953 A | 1/1996 | Shirota et al. |
| 5,554,450 A | 9/1996 | Shi et al. |
| 5,719,467 A | 2/1998 | Antoniadis et al. |
| 5,804,322 A * | 9/1998 | Shi et al. ................. 428/690 |
| 5,891,587 A * | 4/1999 | Hu et al. ................. 428/690 |
| 5,989,737 A | 11/1999 | Xie et al. |
| 6,150,043 A | 11/2000 | Thompson et al. |

FOREIGN PATENT DOCUMENTS

EP   0 650 955 A1   5/1995

OTHER PUBLICATIONS

J. Appl. Phys. (9), May 1, 1989, pp. 3610–3616, Electroluminescence of doped organic thin films, C.W. Tang et al.

* cited by examiner

*Primary Examiner*—Deborah Jones
*Assistant Examiner*—Ling Xu

(57) ABSTRACT

This invention relates to compositions and electroluminescent (EL) devices that have enhanced performance as a result of a mixture of isomeric aromatic amine (IAA) compounds. The mixture can be vacuum evaporated to form amorphous thin films.

13 Claims, 1 Drawing Sheet

ELECTROLUMINESCENT COMPOSITIONS AND DEVICES

FIELD OF THE INVENTION

This invention relates to novel electroluminescent compositions and devices with enhanced performance. The compositions are a mixture of isomeric aromatic amine (IAA) compounds. The mixture can be vacuum evaporated to form amorphous thin films. The electroluminescent (EL) devices incorporate the novel compositions.

BACKGROUND OF THE INVENTION

Organic EL devices are generally composed of a single or multiple layers of organic materials sandwiched between transparent and metallic electrodes. Organic EL devices are attractive owing to the requirement for low driving voltage and the fact that they are generally simple and relatively easy and inexpensive to fabricate. Furthermore, the light generated by organic EL devices are sufficient for use in a variety of ambient light conditions (from little or no ambient light to bright ambient light). There has been an increased interest in developing energy-efficient flat-panel displays based on organic EL devices primarily because of their potential as an emissive display technology which offers unrestricted viewing angles and high luminescence output at low operating voltages. Because of these advantages, organic EL have a potential application in full color flat emissive displays as well as displays in small products, such as pagers, cellular and portable telephones, two-way radios, data banks, etc. However, despite recent advances that have been accomplished in EL device design and fabrication, a number of the current available EL device performance characteristics are not effectively suited for most practical applications. These characteristics include short serviceable life, low EL efficiency, and the rectification of all these performance deficiencies represents one formidable challenge in EL device research and development. Accordingly, one of the features of the present invention in embodiments thereof is to provide organic EL devices which provide extended device life span and excellent EL efficiency.

PRIOR ART

Prior art organic EL devices have been constructed from a laminate of an organic luminescent material and electrodes of opposite polarity, which devices include a single crystal material, such as single crystal anthracene, as the luminescent substance as described, for example, in U.S. Pat. No. 3,530,325. However, these devices require excitation voltages on the order of 100 volts or greater. Subsequent modifications of the device structure through incorporation of additional layers, such as charge injecting and charge transport layers, have led to performance improvement. Illustrative examples of EL devices have been disclosed in publications by Tang et al. in J. Appl. Phys. vol. 65, pp. 3610 to 3616 (1989) and Saito et al. in Mol. Cryst. Liq. Cryst. vol. 253, pp. 125 to 132 (1994), the disclosures of which are totally incorporated herein by reference.

An EL device with an organic dual layer structure comprises one layer adjacent to the anode supporting hole injection and transport, and another layer adjacent to the cathode supporting electron injection and transport. The recombination of charge carriers and subsequent emission of light occurs in one of the layers near the interface between the two layers. Optionally, a fluorescent material capable of emitting light in response to recombination of holes and electrons can be added to one of the layers. In another configuration, an EL device can comprise three separate layers, a hole transport layer, an emission layer, and an electron transport layer, which are laminated in sequence and are sandwiched as a whole between an anode and a cathode.

Specifically, U.S. Pat. No. 4,356,429 discloses an EL device formed of an organic luminescent medium consisting of a hole transporting layer and an electron transporting layer, wherein the hole transporting layer is comprised of a porphyrinic compound. Further, in U.S. Pat. No. 4,539,507 there was substituted an aromatic tertiary amine layer for the hole transporting porphorinic layer. Illustrative examples of the aromatic tertiary amine compounds disclosed in the U.S. Pat. No. 4,539,507 are triphenylamines, such as N,N,N-triphenylamine and N,N,N-tri-p-tolylamine, those containing at least two aromatic tertiary amine moieties such as 1,1-bis(4-di-tolylaminophenyl)cyclohexane, and tetraaryidiamines such as N,N'-bis(3-methylphenyl)-N,N'-diphenyl-4,4'-diaminobiphenyl, N,N,N'N'-tetra-p-tolyl-4,4'-diaminobiphenyl. Also, of interest with respect to EL devices are U.S. Pat. Nos. 5,487,953 and 5,554,450.

Although recent performance improvements in organic EL devices have suggested a potential for widespread use, most practical applications require limited operation voltage or light output variance over an extended period of time. While hole transport materials comprised of certain aromatic tertiary amines are generally known to facilitate hole injection and hole transport processes which lead to improved device performance for organic EL devices. The thermal and morphological instability of these materials as the hole injecting and transport thin film layers has resulted in the short operational lifetime and poor durability of the organic EL devices for practical applications.

Many current organic EL devices possess limited operational lifetime, particularly at a high temperature of, for example, above 40° C. One aspect which significantly affects the performance of organic EL devices is the thermal and morphological stability of the organic layers comprising the devices. These layers are amorphous thin films formed by vacuum deposition technique. The transition of an organic thin film from an amorphous state to a crystalline state can result in a physical or morphological change in the thin film. The integrity of organic EL devices with multi-layer structures is sensitive to this morphological change primarily because the charge carriers transport characteristics are substantially affected by the microscopic structures of the organic layers. This also will led the organic EL device tends to grow dark spots and shot circuit.

There is a need to use materials that can form amorphous thin film without recrystallization for long storage and operational life especially at elevated temperature. Polymer materials may have such advantage. However, it is not only difficult to synthesis and purify such materials, but also polymeric materials can not form thin film by vacuum deposition techniques. There is also a need to develop materials which are readily accessible synthetically, and which can be prepared in high yields and with excellent electronic purity. Another need resides in the provision of materials used in EL devices which are capable of forming thermally and morphologically stable thin films by for example, vacuum deposition techniques. A still further need is the preparation of new hole transport materials suitable for organic EL device applications, and which materials possess excellent hole transport characteristics, enabling the EL devices to operate at low voltages. These and other needs can be achievable with the EL devices of the present invention in embodiments thereof.

SUMMARY OF THE INVENTION

It is an object of the present invention to provide organic EL devices with many of the advantages illustrated herein.

Another object of the present invention is to provide organic EL devices with enhanced thermal stability and operational stability.

In another object of the present invention there are provided improved EL devices which exhibit high electroluminescence efficiency at relatively low operating voltages.

Yet in another object of the present invention there are provided improved EL devices comprising an anode, a cathode, and an organic electroluminescent medium is between the anode and the cathode, wherein the organic electroluminescent medium has at least one layer con a mixture of isomeric aromatic amines as the hole injection or transport layer.

Another object of the present invention is the provision of a certain mixture of isomeric aromatic amine compounds for EL devices, which compounds have a high glass transition temperature and a preparation process of the mixture of isomeric aromatic amines.

A further object of the present invention is the provis ion of EL devices with a mixture of isomeric aromatic amines which possess excellent hole injecting and transporting capability and superior thermal stability. This mixture of isomeric aromatic amines can be readily vacuum deposited as thin films for use as hole injection and or transport components in EL devices.

In embodiments, the present invention relates to layered organic EL devices comprising an anode, a cathode and between the anode and the cathode, an organic luminescent medium comprised of a hole injecting and hole transporting zone or layer containing a mixture of isomeric aromatic amines and an electron injecting and transporting zone or layer. These EL devices possess a number of advantages such as improved thermal stability, long device life, high electroluminescence efficiency, superior hole injecting and electron transporting characteristics. The devices can be readily fabricated using vacuum deposition techniques. The invention EL devices exhibit improved thermal and operational stability, and excellent device durability at elevated temperatures for both operation and storage.

In embodiments, the present invention relates to EL devices that are comprised in the following order: a supporting substrate, an anode, a hole injecting and transporting zone or layer, an electron injecting and transporting zone or layer, and a cathode, and wherein the hole injecting and transporting zone is comprised of a mixture of isomeric aromatic amines represented by the following Formula 1, $$[(A_1)_a + (A_2)_b + \text{- - -} + (A_n)_x] \quad (1)$$

wherein:

$A_1, A_2, \ldots$ and $A_n$ represent each individual components of the mixture of isomeric aromatic amines; These isomeric amines contain at least 24 carbon atoms and have a general molecular formula:

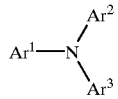

(2)

wherein:

$Ar^1$ is an aryl group or substituted aryl group containing at least 18 carbon atoms; $Ar^2$ and $Ar^3$ are individual aryl groups or substituted aryl groups containing at least 6 carbon atoms;

Each individual component $(A_1, A_2, \ldots$ and $A_n)$ in the mixture has the same molecular formula. The difference of the individual component is the sequences of their atoms, or the point of attachment of substituents;

a, b, - - - and x are the ratio of each of the components $A_1$, $A_2, \ldots A_n$ in the mixture, range from 0 to 100%. The sum of a, b, - - - x is 1;

There are at least two components in a mixture of aromatic amine isomers.

DRAWINGS

In drawings which illustrate specific embodiments of the invention, but which should not be construed as restricting the spirit or scope of the invention in any way:

DESCRIPTION OF EMBODIMENTS

I have discovered unexpectedly that the above-mentioned complexities and difficulties associated with conventional electroluminescent compounds, and the associated organic EL devices, can be largely overcome by providing a mixture of novel hole transporting isomers which are capable of forming amorphous thin films with enhanced thermal and morphological stability. Organic EL devices fabricated therefrom have superior hole injection characteristics, high excellent EL efficiency, and enhanced operation stability and device durability, especially at elevated temperatures.

Figure 1:
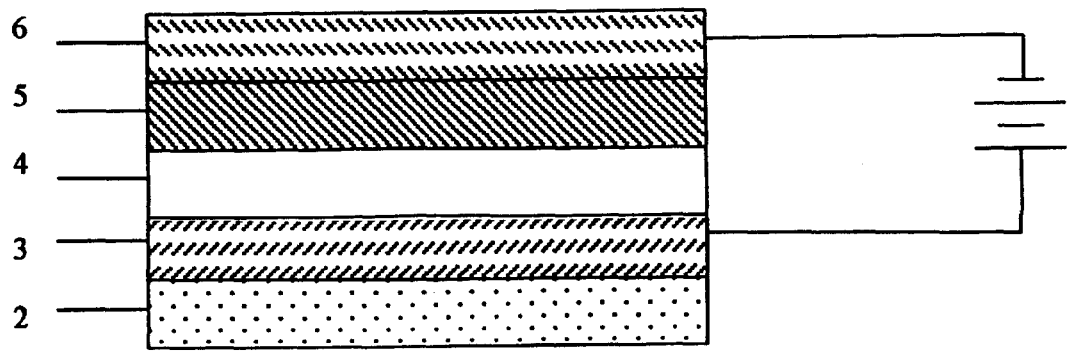
FIG. 1 illustrates a five component electroluminescent device.

Embodiments of the present invention will be described in more details with reference to the schematic diagram as provided in FIG. 1, and in FIG. 2. More specifically, FIG. 1 illustrates an EL device which comprises an organic light emitting diode comprised of a supporting substrate 2 of, for example, glass, an anode 3, a vacuum deposited hole injecting and hole transporting layer 4 comprised of a mixture of isomeric aromatic amines, an electron injecting and electron transporting layer 5, and in contact therewith a low work function metal as a cathode 6. In the EL device a luminescent zone, in which the electron-hole recombination takes place with subsequent light emission, encompasses the hole transport layer and/or the electron transport layer. Optionally, a fluorescent material, which is capable of emitting light subsequent to electron-hole recombination, may be added to the luminescent zone wherein the charge transport component functions as the host material.

Figure 2:
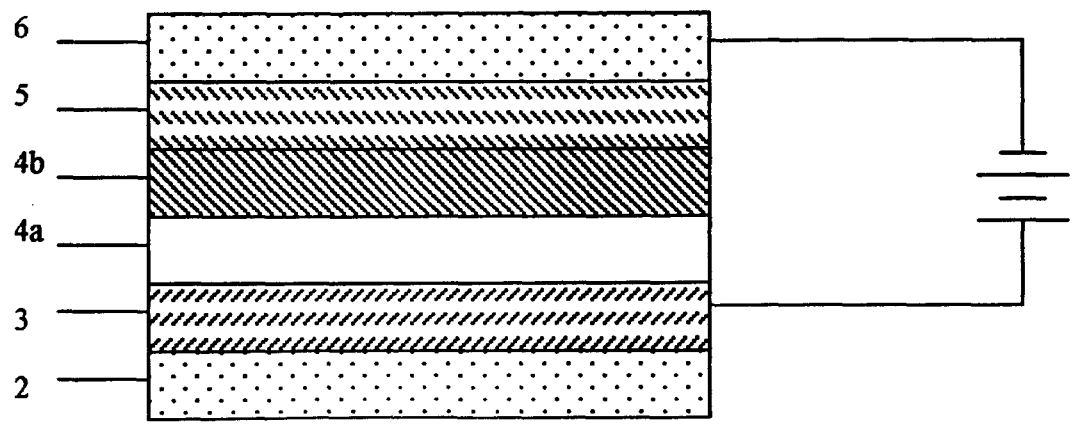
FIG. 2 illustrates a six component electroluminescent device.

In another embodiment as illustrated in FIG. 2, the light emitting diode 1 is comprised of a supporting substrate 2 of, for example, glass, an anode 3, a mixture of isomeric aromatic amines of the formulas illustrated herein, organic hole transporting zone 4, an organic electron transporting zone 5, and in contact therewith a cathode 6. In this device structure, the transporting zone is comprised of one or more transport layers as opposed to the single layer transporting zone of the device structure of FIG. 1. Specifically, the hole transporting zone 4 of FIG. 2 is comprised of a layer 4a which facilitates hole injection, and a mixture of isomeric aromatic amines layer 4b which transports hole carriers. The electron transporting zone 5 is comprised of a layer which facilitates electron injection, and a layer which transports electrons.

Illustrative examples of supporting substrates include polymeric components, glass and the like, and polyesters like MYLAR.RTM., polycarbonates, polyacrylates, polymethacrylates, polysulfones, quartz, and the like. Other substrates can be selected providing, for example, that they are essentially nonfunctional and can support the other layers. The thickness of the substrate can be, for example, from about 25 to about 1,000 microns or more, and more specifically, from about 50 to about 6,000 microns depending, for example, on the structural demands of the device.

Examples of the anode contiguous to the substrate include positive charge injecting electrodes such as indium tin oxide, tin oxide, gold, platinum, or other materials, such as electrically conductive carbon, conjugated polymers such as polyaniline, polypyrrole, and the like, with, for example, a work function equal to, or greater than about 4 electron volts, and more specifically, from about 4 to about 6 electron volts. The thickness of the anode can range from about 10 to about 5,000 Angstroms with the preferred range being dictated by the optical constants of the anode material. One preferred range of thickness is from about 20 to about 1,000 Angstroms (Angstroms).

In embodiments, the hole transport layer 4 is as illustrated herein and is comprised of a mixture of isomeric aromatic amines represented by the general structural Formula 1.

The commonly used hole transport materials are single components of triaryl amines, such as:

NPB

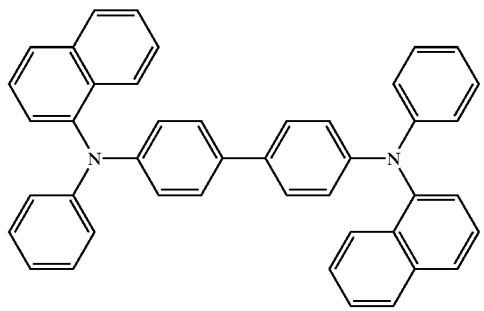

NNTPB

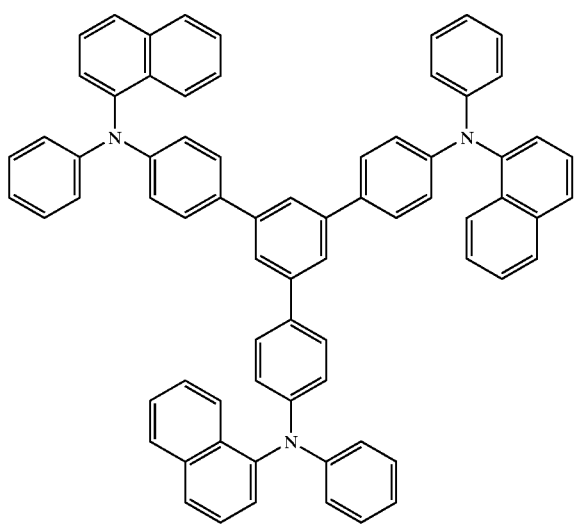

NNB

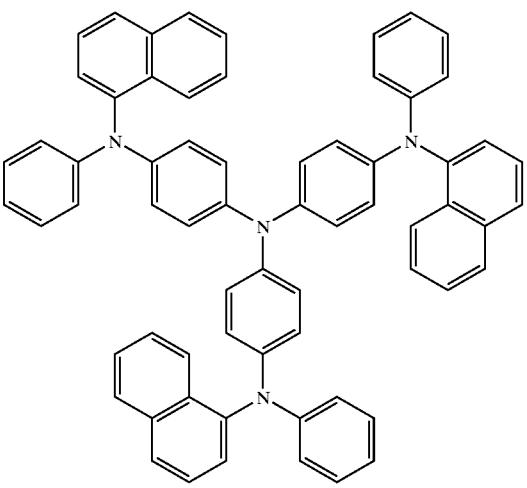

NPTPA

By comparison with the above commonly used hole transport materials, the mixtures of isomeric aromatic amines according to the invention offer a number of advantages as illustrated herein in that, for example, they possess excellent charge transport properties and a high glass transition temperature. And they are capable of forming thermally and morphologically stable thin films by vacuum evaporation techniques. Since thin film recrystallization can be significantly depressed by physical mixture of compounds rather than any of a single component, the films of the mixture of isomeric aromatic amines are highly amorphous. Thus dark spot growth of EL devices can also be minimized by using the mixture of isomeric aromatic amines.

The mixture of isomeric aromatic amines can be prepared by the reaction of a mixture of isomeric diarylamines with aryl halides. The halo atom is selected from iodine, bromine, chlorine or OTf group. Tf is trifluoromethanesulfonyl.

The following Schemes are intended to illustrate but not limit to the scope of the present invention:

Scheme 1
Preparation of the mixture containing two isomeric aromatic amines

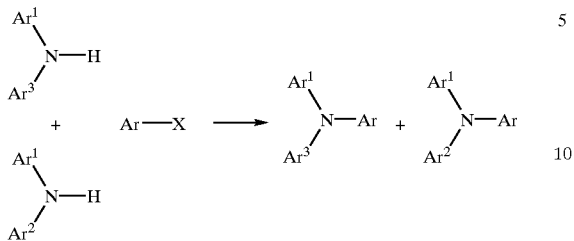

wherein:
Ar, $Ar^1$, $Ar^2$ and $Ar^3$ are individually aryl groups or substituted aryl groups containing at least 6 carbon atoms;
X is selected from iodine, bromine, chlorine or an OTf group. Tf is trifluoromethanesulfonyl.

Scheme 2
Preparation of the mixture containing three isomeric aromatic amines

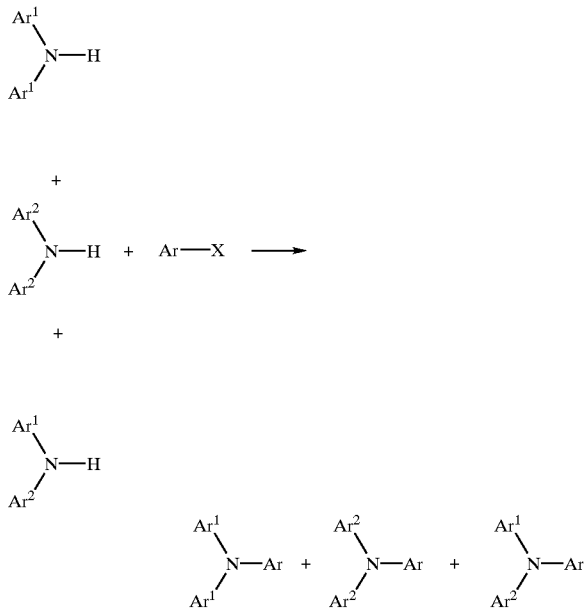

wherein:
Ar, $Ar^1$, $Ar^2$ and $Ar^3$ are individually aryl groups or substituted aryl groups containing at least 6 carbon atoms;
X is selected from iodine, bromine, chlorine or an OTf group. Tf is trifluoromethanesulfonyl.

Scheme 3
Preparation of the mixture containing three isomeric aromatic amines

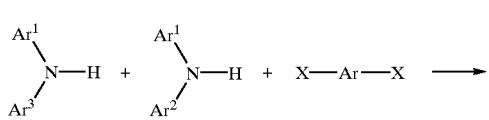

wherein:
Ar, $Ar^1$, $Ar^2$ and $Ar^3$ are individually aryl groups or substituted aryl groups containing at least 6 carbon atoms;
X is selected from iodine, bromine, chlorine or an OTf group. Tf is trifluoromethanesulfonyl.

Scheme 4
Preparation of the mixture containing four isomeric aromatic amines

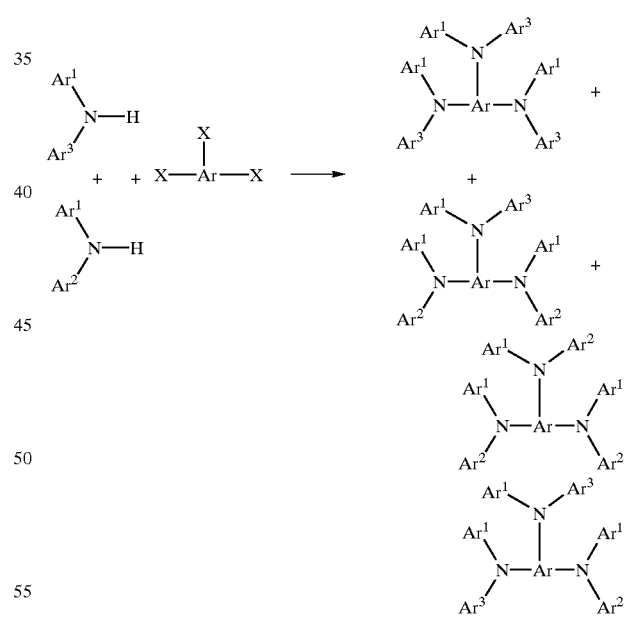

wherein:
Ar, $Ar^1$, $Ar^2$ and $Ar^3$ are individually aryl groups or substituted aryl groups containing at least 6 carbon atoms;
X is selected from iodine, bromine, chlorine or an OTf group. Tf is trifluoromethanesulfonyl.

Scheme 5
Preparation of the mixture containing four isomeric aromatic amines

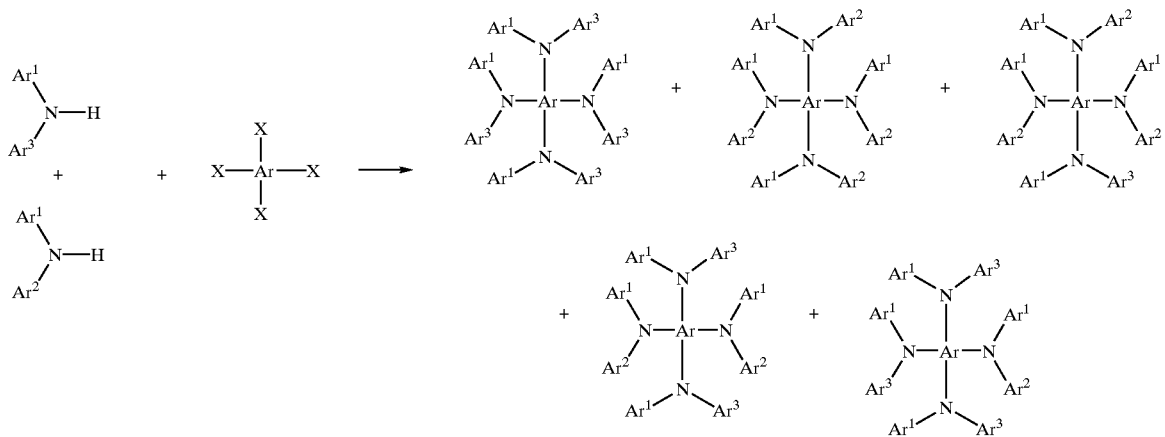

wherein:

Ar, $Ar^1$, $Ar^2$ and $Ar^3$ are individually aryl groups or substituted aryl groups containing at least 6 carbon atoms;

X is selected from iodine, bromine, chlorine or an OTf group. Tf is trifluoromethanesulfonyl.

Scheme 6
Preparation of the mixture containing six isomeric aromatic amines

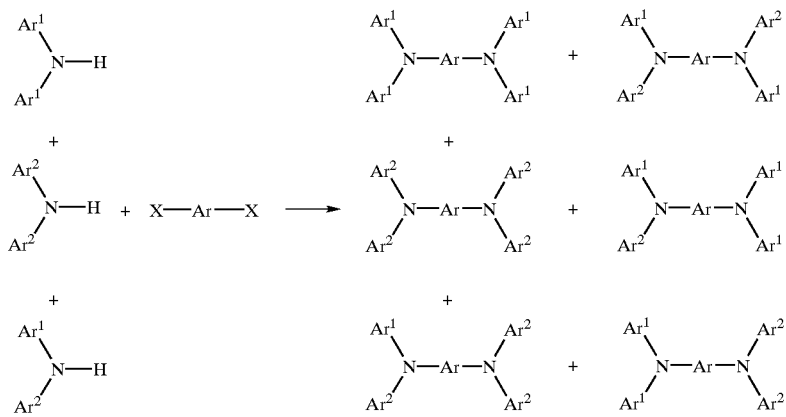

wherein:

Ar, $Ar^1$, $Ar^2$ and $Ar^3$ are individually aryl groups or substituted aryl groups containing at least 6 carbon atoms;

X is selected from iodine, bromine, chlorine or an OTf group. Tf is trifluoromethanesulfonyl.

Scheme 7
Preparation of the mixture containing ten isomeric aromatic amines

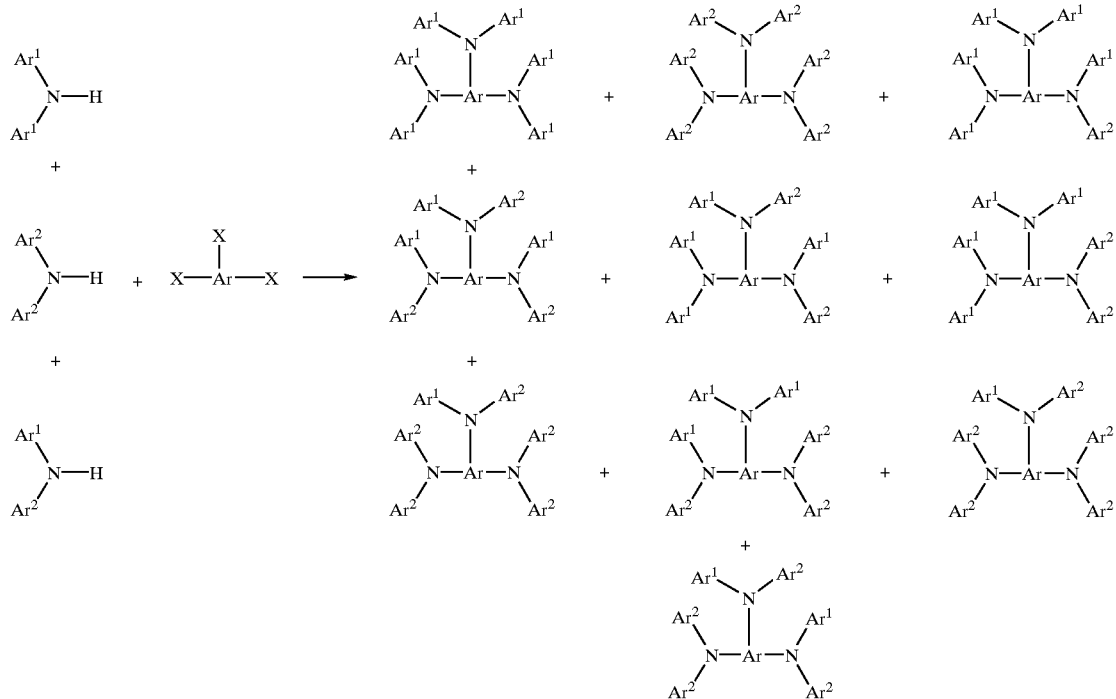

wherein:

Ar, $Ar^1$, $Ar^2$ and $Ar^3$ are individually aryl groups or substituted aryl groups containing at least 6 carbon atoms;

X is selected from iodine, bromine, chlorine or an OTf group. Tf is trifluoromethanesulfonyl.

Representative examples of a mixture of isomeric aromatic amines in accordance with the invention include those illustrated as follows. The following Examples are provided to further define various species of the present invention. It is noted that these Examples are intended to illustrate but not limit to the scope of the present invention.

The following mixture examples contain two isomeric aromatic amines:

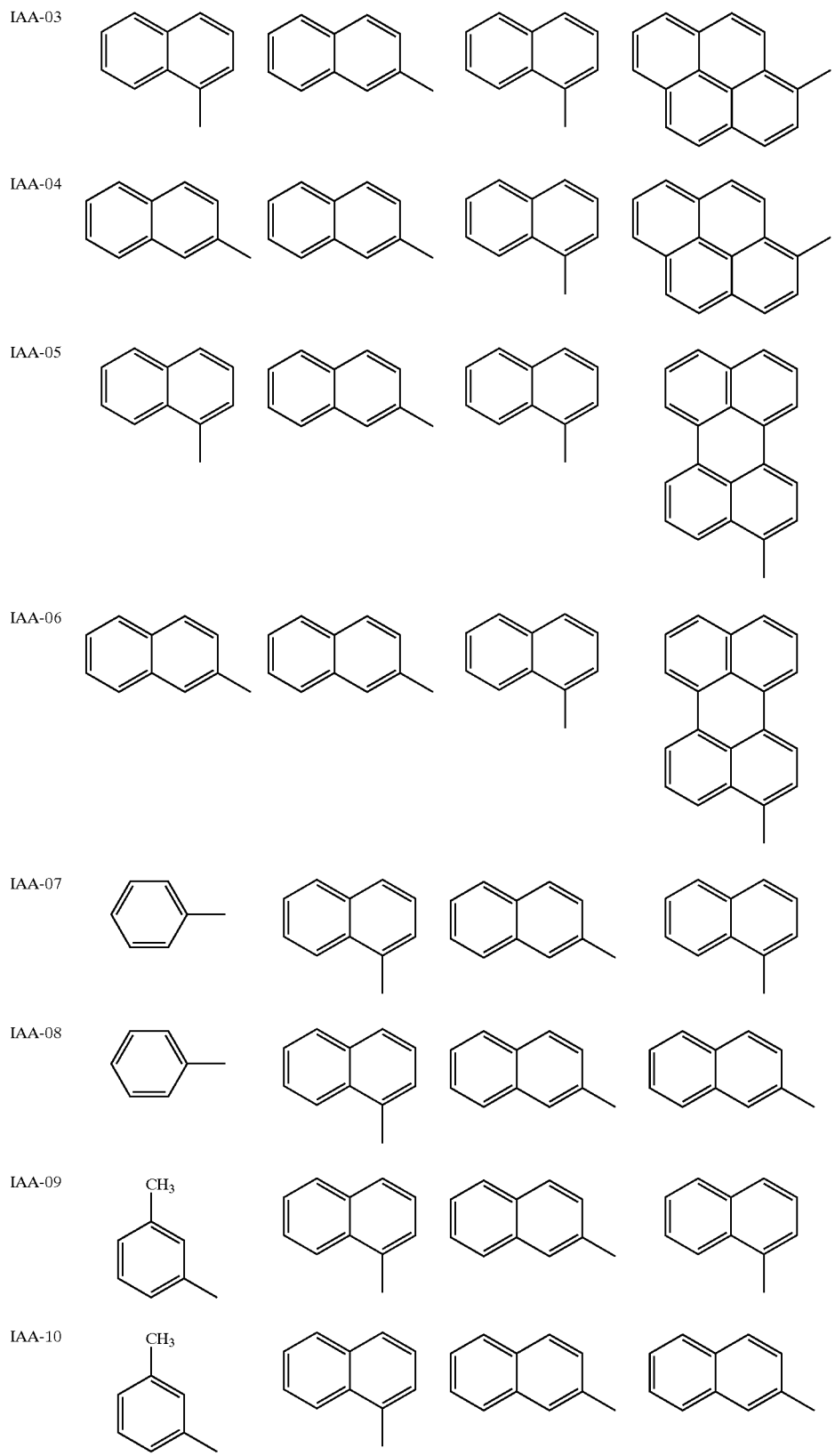

-continued
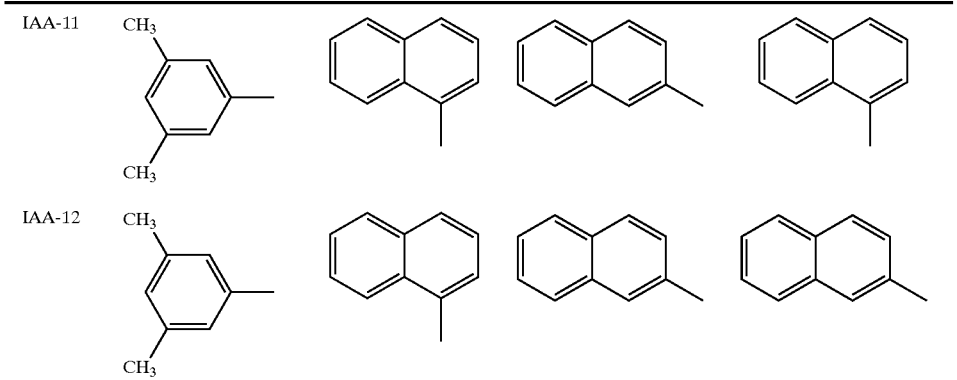
wherein:
- a and b are the ratio of isomeric aryl amines in the mixture, range from 0 to 100%. The sum of a and b is 1.
The following mixture examples contain three isomeric aromatic amines:
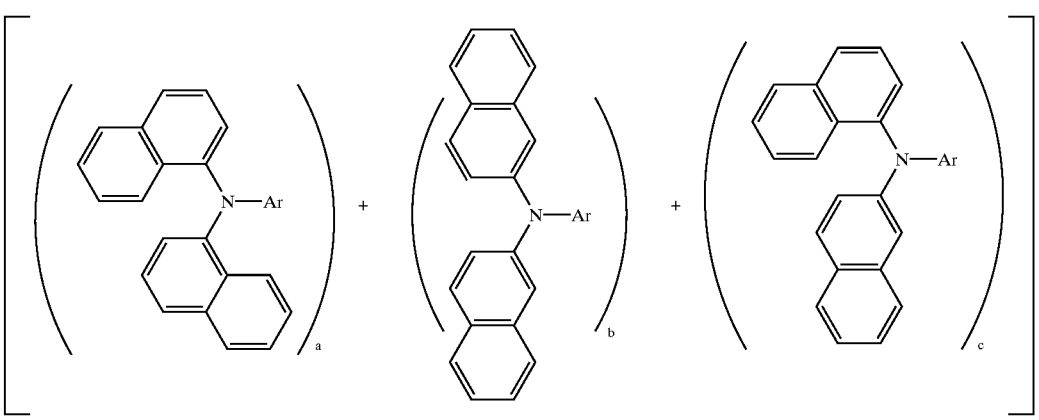
Mixture of isomeric aromatic amines      Ar
IAA-13
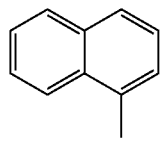
IAA-14
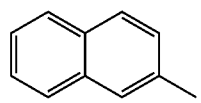
IAA-15
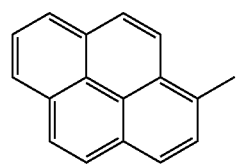

-continued
IAA-16 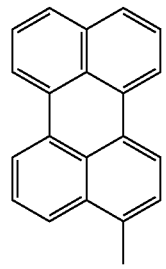
IAA-17 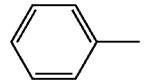
IAA-18 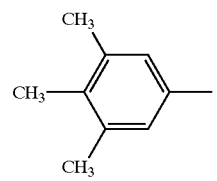
IAA-19 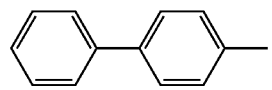
IAA-20 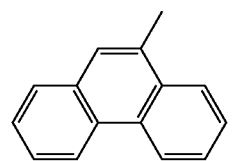
wherein:
a, b, and c are the ratio of isomeric aryl amines in the mixture, range from 0 to 100%. The sum of a, b, and c are 1.
The following mixture examples contain three isomeric aromatic amines:
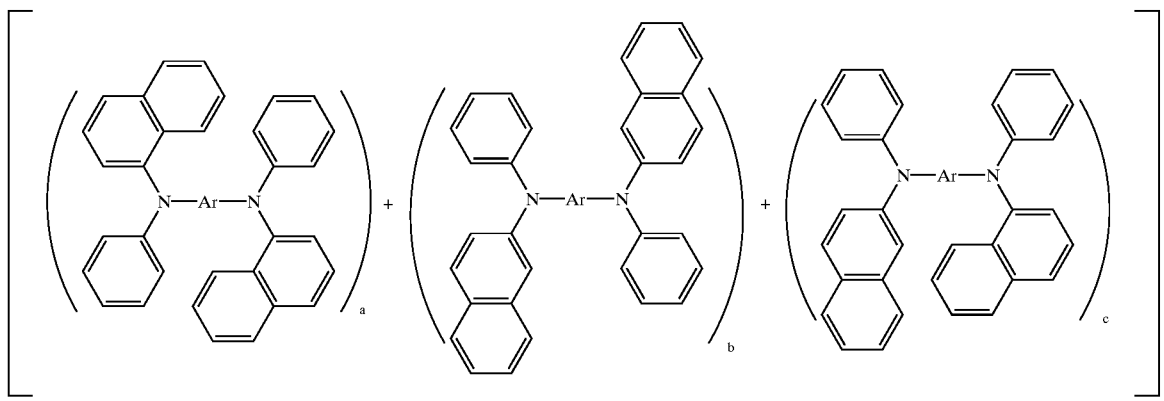
Mixture of isomeric aromatic amines      Ar

| | |
|---|---|
| IAA-21 | 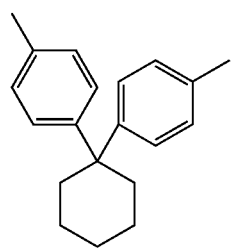 |
| IAA-22 | 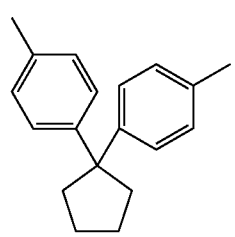 |
| IAA-23 | 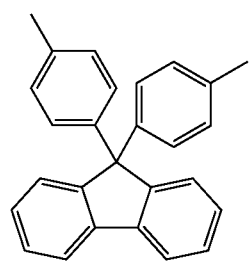 |
| IAA-24 | 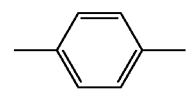 |
| IAA-25 | 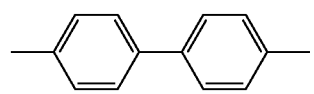 |
| IAA-26 | 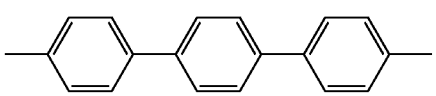 |
wherein:
  a, b, and c are the ratio of isomeric aryl amines in the mixture, range from 0 to 100%. The sum of a, b, and c are 1.
The following mixture examples contain four isomeric aromatic amines:

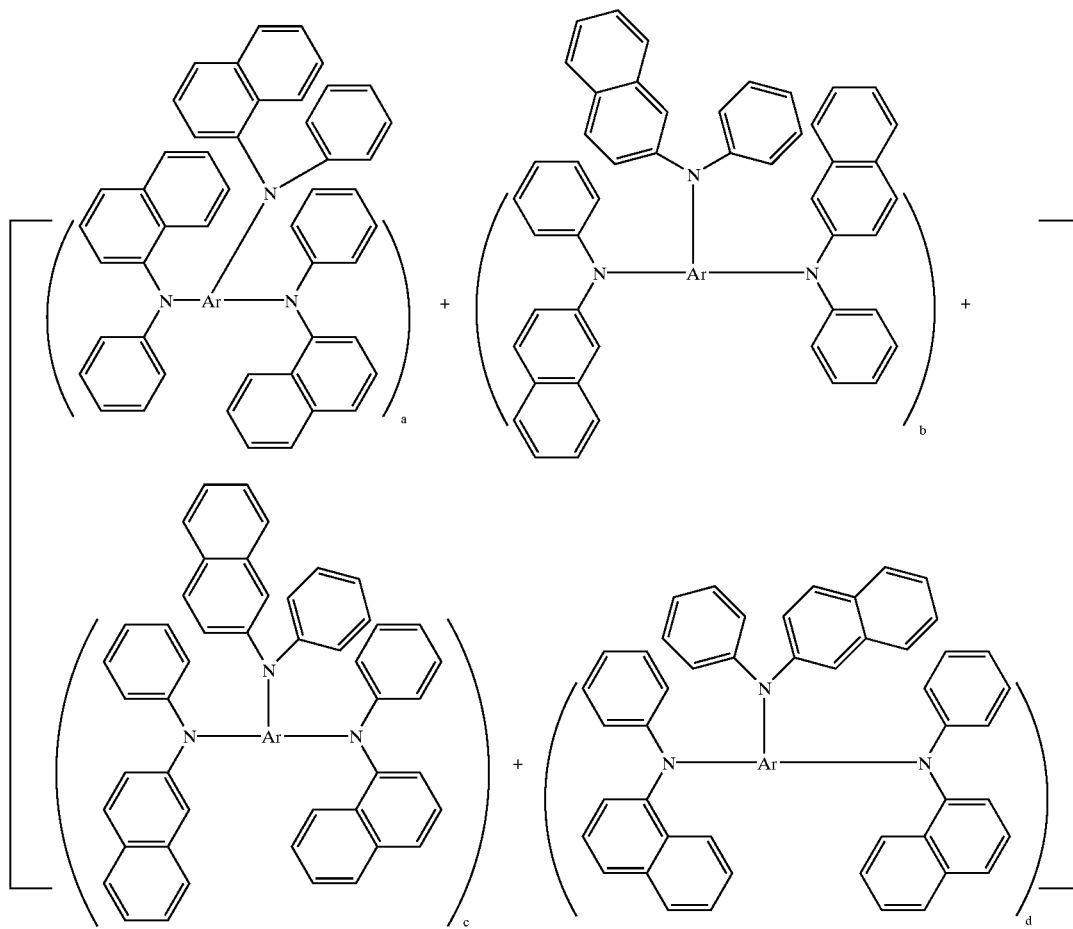
Mixture of isomeric aromatic amines
IAA-27
Ar
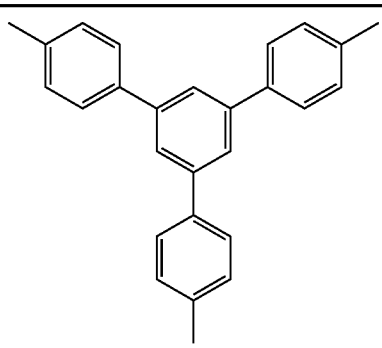
IAA-28
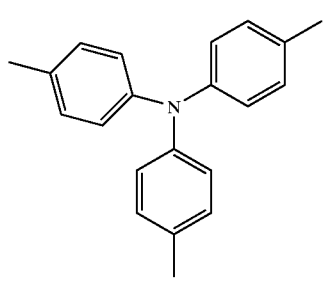
wherein:
a, b, c and d are the ratio of isomeric aryl amines in the mixture, range from 0 to 100%. The sum of a, b, c and d is 1.
The following mixture examples contain five isomeric aromatic amines:

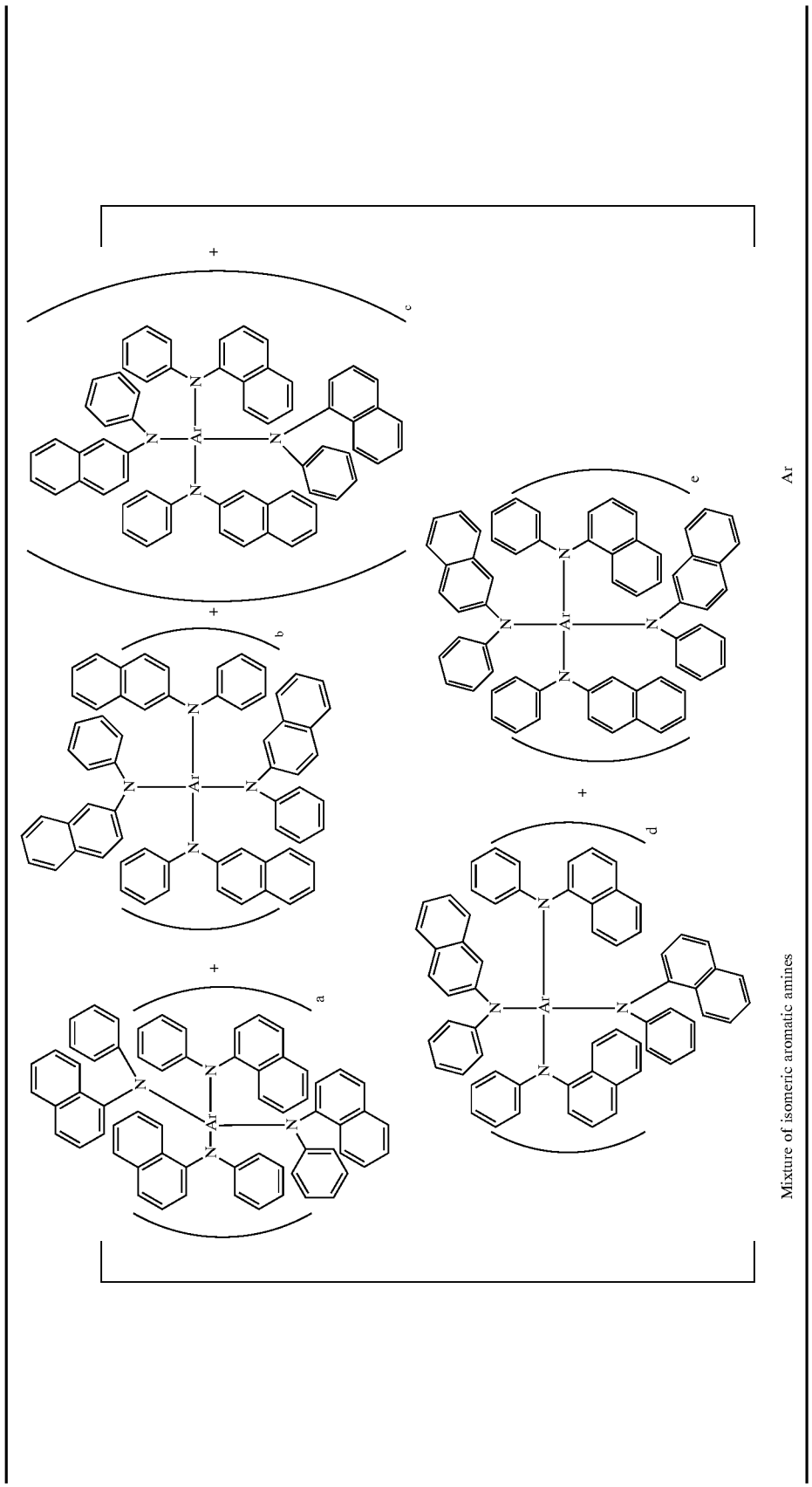

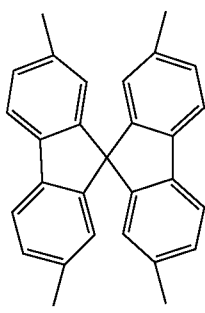
IAA-29
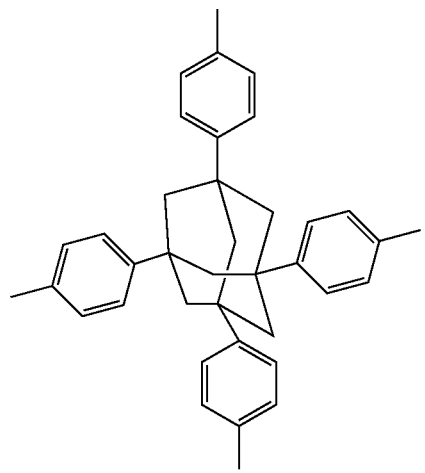
IAA-30 wherein:
a, b, c, d and e are the ratio of isomeric aryl amines in the mixture, range from 0 to 100%. The sum of a, b, c, d and e is 1.
The following mixture examples contain six isomeric aromatic amines:
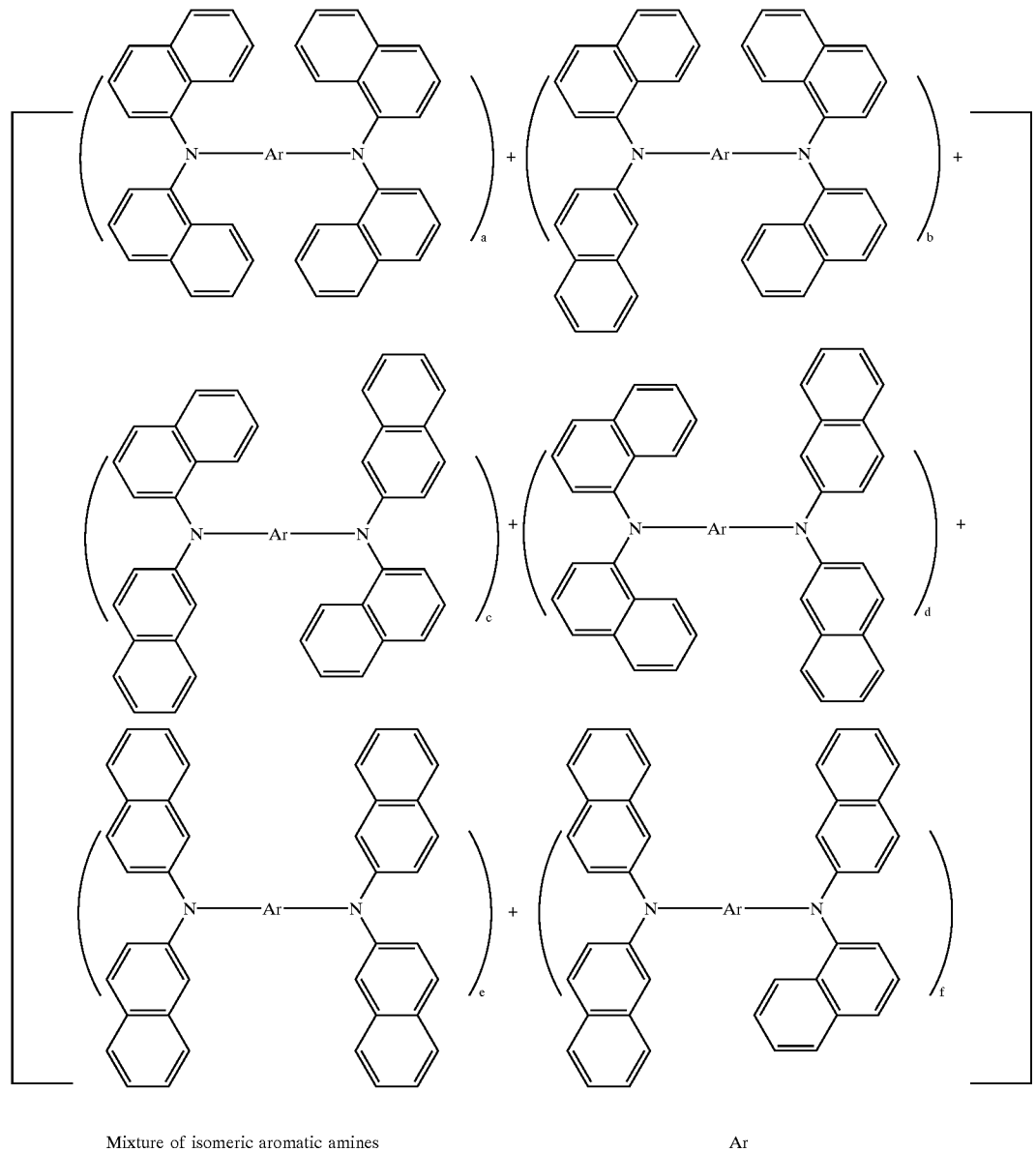
Mixture of isomeric aromatic amines       Ar
IAA-31
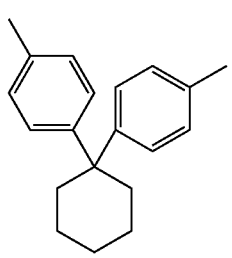

| | |
|---|---|
| IAA-32 | 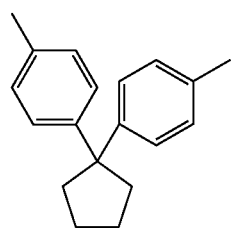 |
| IAA-33 | 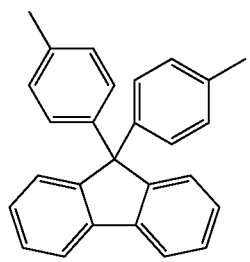 |
| IAA-34 | 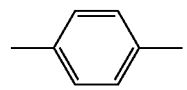 |
| IAA-35 | 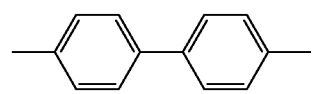 |
| IAA-36 | 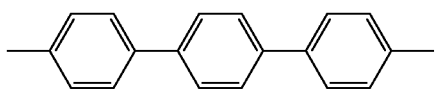 |
wherein:
a, b, c, d, e and f are the ratio of isomeric aryl amines in the mixture, range from 0 to 100%. The sum of a, b, c, d, e and f is 1.
The following mixture examples contain ten isomeric aromatic amines:
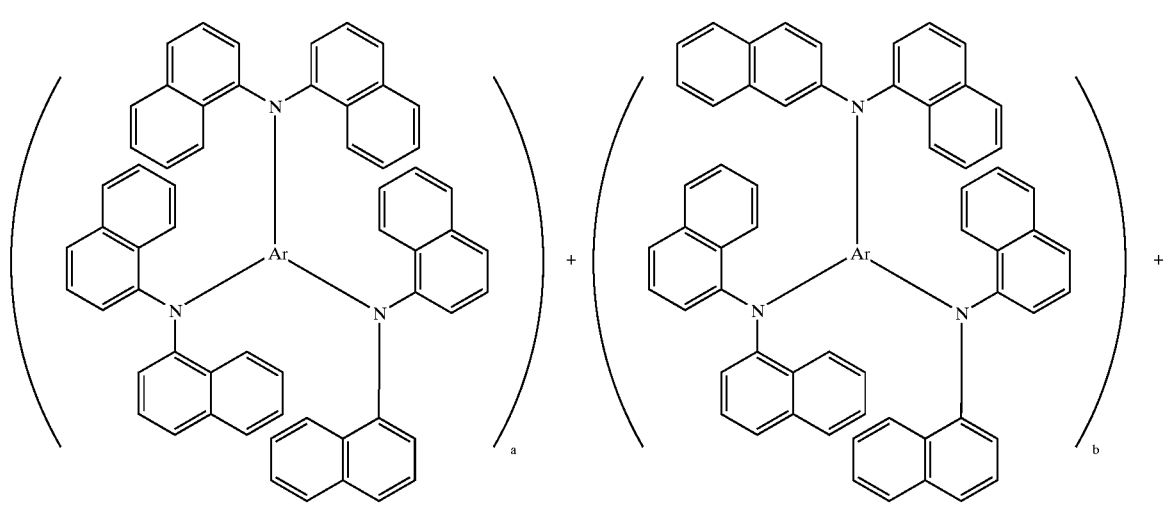

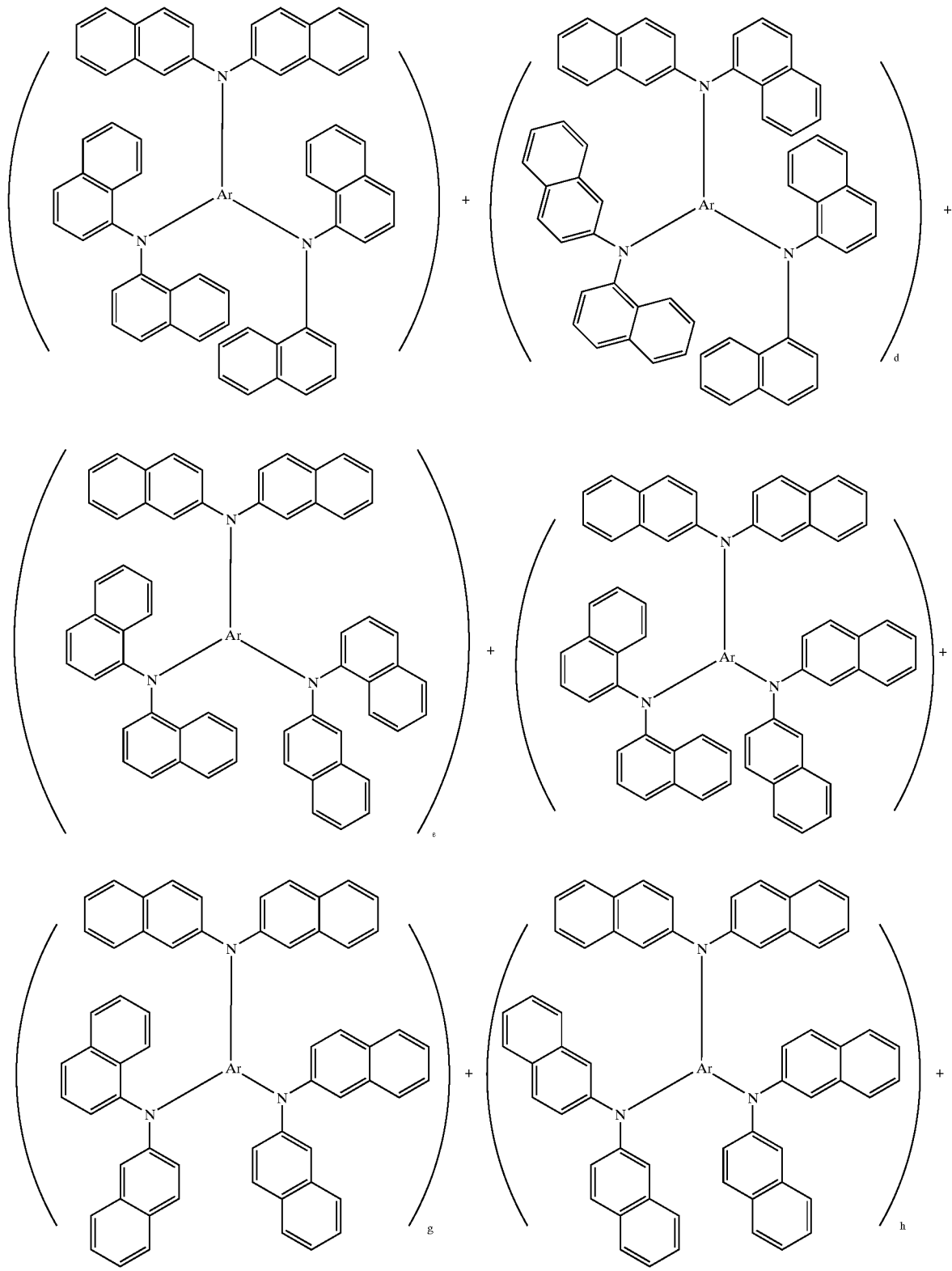

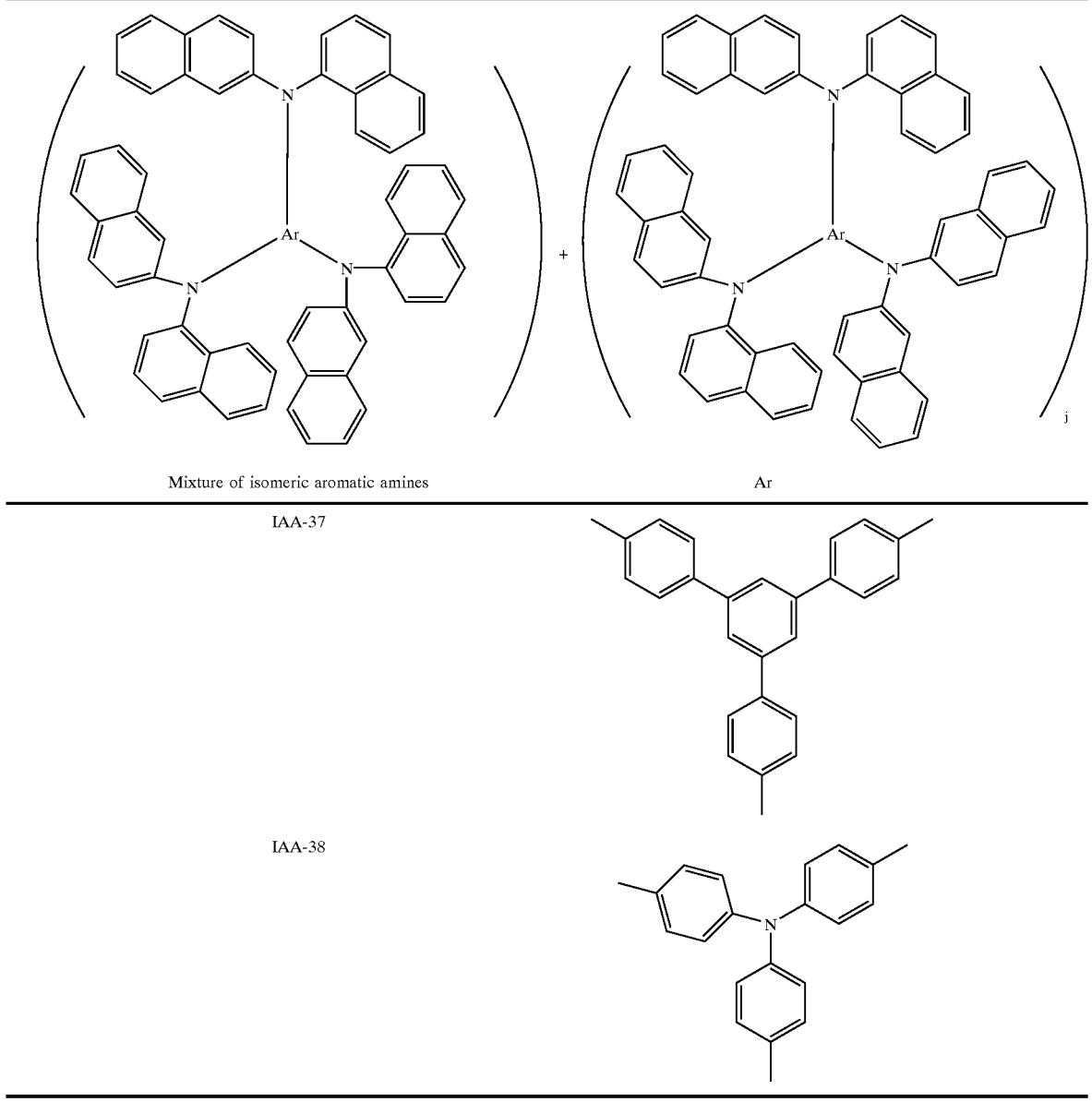

Mixture of isomeric aromatic amines

IAA-37

IAA-38 wherein:
  a, b, c, d, e, f, g, h, i, and j are the ratio of isomeric aryl amines in the mixture, range from 0 to 100%. The sum of a, b, c, d, e, f, g, h, i, and j is 1.

In accordance with the present invention, the hole injecting and hole transporting zone can be entirely formed of a single layer comprised of an aforementioned mixture of isomeric aromatic amines.

When the mixture of isomeric aromatic amine compounds is selected in combination with a triarylamine, tetraarylamine, and the like in forming the hole injecting and transporting zone, the amine is positioned as a layer, for example at a thickness of from about 100 Angstroms, interposed between the mixture of isomeric aromatic amines layer and the electron injecting and transporting zone.

The electron injecting and transporting zone in the EL devices of the present invention can be comprised of any conventional electron injecting and transporting compound or compounds. Examples of useful electron transport compounds include fused ring luminescent materials such as anthracene, phenathrecene, pyrene, perylene, and the like as illustrated by U.S. Pat. No. 3,172,862; butadienes such as 1,4-diphenylbutadiene and tetraphenylbutadiene, and stilbenes, and the like as illustrated in U.S. Pat. Nos. 4,356,429 and 5,516,577; optical brightness such as those disclosed by U.S. Pat. No. 4,539,507, the disclosures of which are totally incorporated herein by reference.

Particularly preferred electron transport materials are metal chelates of 8-hydroxyquinoline disclosed in U.S. Pat. Nos. 4,539,507; 5,151,629, and 5,150,006. Illustrative examples of the metal chelated compounds include tris(8-hydroxyquinolinate)aluminum (AlQ3), tris(8-hydroxyquinolinate) gallium, bis(8-hydroxyquinolinate) magnesium, bis(8-hydroxyquinolinate)zinc, tris(5-methyl-8-hydroxyquinolinate)aluminum, tris(7-propyl-8-quinolinolato)aluminum, bis-benzo{f}-8-quinolinate!zinc, bis(10-hydroxybenzo☐!quinolinate)beryllium, bis(2- methylquinolinolato) aluminum(III)-.mu.-oxo-bis(2-methyl-8-quinolinolato) aluminum(III), bis(2-methyl-8-quinolinolato) (phenolato)aluminum, bis(2-methyl-8-quinolinolato) (para-phenylphenolato)aluminum, bis(2-methyl-8-quinolinolato)(2-naphthalolato)aluminum, and the like.

The disclosures of each of the above patents is totally incorporated herein by reference. Another class of preferred electron injecting and transporting compounds is metal thioxinoid compounds, disclosed in U.S. Pat. No. 5,648,542. Illustrative examples of metal thioxinoid compounds include bis(8-quinolinethiolato), bis(8-quinolinethiolato) cadmium, tris(8-quinolinethiolato)gallium, tris(8-quinolinethiolato)indium, bis(5-methylquinolinethiolato) zinc, tris(5-methylquinolinethiolato)gallium, tris(5-methylquinolinethiolato)indium, bis(5-methylquinolinethiolato) cadmium, bis(3-methylquinolinethiolato)cadmium, bis(5-methylquinolinethiolato)zinc, bisenzo{f}-8-quinolinethiolatozinc, bis-methylbenzo{f}-8-quinolinethiolatozinc, bis, 7-dimethylbenzo{f}-8-quinolinethiolatozinc, and the like.

In embodiments of the present invention, the total thickness of the organic luminescent medium, which includes the hole injecting and transporting zone 4 and the electron injecting and transporting zone 5, is preferably, for example, less than about 1 micron, for example from about 0.05 to about 1 micron, to maintain a current density compatible with an efficient light emission under a relatively low voltage applied across the electrodes. Suitable thickness of the hole injecting and transporting layer can range from about 50 to about 2,000 Angstroms, and preferably from about 400 to 1,000 Angstroms. Similarly, the thickness of the electron injecting and transporting layer can range from about 50 to about 2,000 Angstroms, and preferably from about 400 to 1,000 Angstroms.

The cathode 6 can be comprised of any metal, including high or low work function metals. The cathode which can be derived from a combination of a low work function metal, for example less than about 4 eV, for example from about 2 to about 4, and at least one second metal can provide additional advantages such as improved device performance and stability. Suitable proportions of the low work function metal to the second metal may range from less than about 0.1 percent to about 99.9 percent by weight, and in embodiments are from about 1 to about 90 weight percent. Illustrative examples of low work function metals include alkaline metals, Group 2A or alkaline earth metals, and Group III metals including rare earth metals and the actinide group metals. Lithium, magnesium and calcium are particularly preferred.

The thickness of cathode 6 ranges from, for example, about 10 to about 5,000 Angstroms, and more specifically, from about 50 to about 250 Angstroms. The Mg:Ag cathodes of U.S. Pat. No. 4,885,211 constitute one preferred cathode construction. Another preferred cathode construction is described in U.S. Pat. No. 5,429,884, wherein the cathodes are formed from lithium alloys with other high work function metals such as aluminum and indium. The disclosures of each of the patents are totally incorporated herein by reference.

Both the cathode 6 and anode 3 of the organic EL devices of the present invention can be of any convenient form. A thin, for example about 200 Angstroms, conductive anode layer can be coated onto a light transmissive substrate, for example, a transparent or substantially transparent glass plate or plastic film. The EL device can include a light transmissive anode 3 formed from tin oxide or indium tin oxide coated on a glass plate. Also, very thin, for example less than 200 Angstroms, such as from about 50 to about 200 Angstroms, light-transparent metallic anodes, can be selected, such as gold, palladium, and the like. In addition, transparent or semitransparent thin, for example 200 Angstroms, conjugated polymers, such as polyaniline, polypyrrole, and the like, can be selected. Any light transmissive polymeric film, for example from about 50 to about 200 Angstroms in thickness, can be elected as the substrate. Further, suitable forms of the anode 3 and cathode 6 are illustrated by U.S. Pat. No. 4,885,211, the disclosure of which is totally incorporated herein by reference.

The photoconductive imaging member can be comprised of a supporting substrate, such as MYLAR.RTM., polymers, metals like aluminum, and thereover a photogenerating layer containing known photogenerating pigments, such as phthalocyanines, selenium, hydroxygallium phthalocyanines, titanyl phthalocyanines, perylenes, and the like, and which pigments can be dispersed in resin binders. In contact with the photogenerating layer and situated thereover is a charge transport layer comprised of the mixture of amines illustrated herein, and which amines may be dispersed in resin binders. The resin binders, thickness of each of the layers, and amounts of components selected for each layer in the like are illustrated in a number of issued United States patents, such as U.S. Pat. Nos. 4,265,990; 4,585,884; 4,584,253; 4,563,408; 4,587,189; 4,555,463; 5,153,313; 5,614,493, and 5,189,155; and U.S. Pat. No. 5,645,965, the disclosures of each of these patents and patent application being totally incorporated herein by reference.

EXAMPLES

The following Examples are provided to further define various species of the present invention. It is noted that these Examples are intended to illustrate but not limit the scope of the present invention.

Synthesis of the mixture of isomeric aromatic amines

General Synthesis

Pd(OAc)$_2$ (0.025% mol %) and P(t-Bu)$_3$ (0.10 mol %) were added to the suspension of aryl halide (40 mmol), isomeric diarylamines (total 44 mmol) (the ratio of per halide is 1.1 diarylamine) and NaOBu-t (48 mmol) in toluene (or xylenen) (50 mL) under N$_2$ atmosphere. The mixture was heated for 2 to 12 hours at 100° C. Subsequently, the reaction mixture was cooled to room temperature. Water (60 mL) was then added into it. The organic layer was separated. After removal of solvent, the residue was subjected to pass through a silicon gel column to remove the dark color. After removal of solvents and dried, the yield ranges from 85% to 97%. The composition of the mixture of isomeric aromatic amines was determined by GC or HPLC-MS. The synthetic procedures and results are summarized in Table 1.

TABLE 1
Synthesis of various mixtures of isomeric aromatic amines
| Examples | Mixture of isomeric aromatic amines | diaryl amines (mol ratio) | aryl halides (mol ratio) | Yield | The number of isomers in the mixture founded by GC |
|---|---|---|---|---|---|
| 1 | IAA-25 | 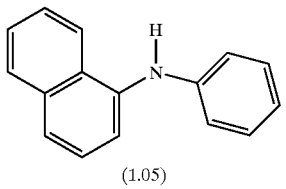 | 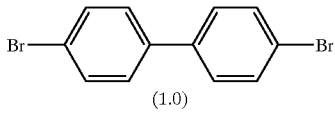 | 92% | 3 |
| 2 | IAA-27 | 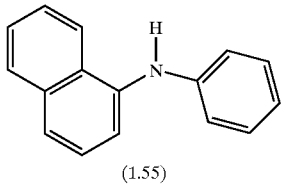 | 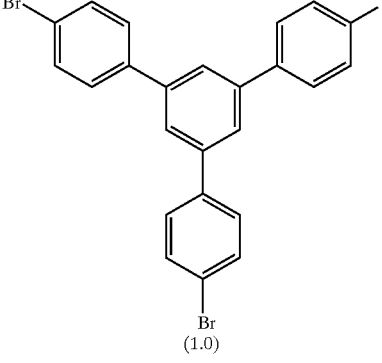 | 87% | 4 |
| 3 | IAA-28 | 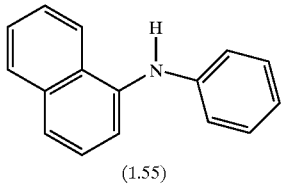 | 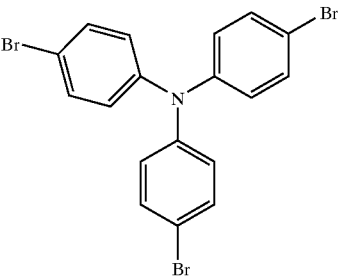 | 85% | 4 |

TABLE 1-continued
| | | | | | |
|---|---|---|---|---|---|
| 4 | IAA-35 | 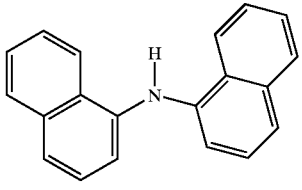 (0.7) <br> (0.7) <br> (0.7) | 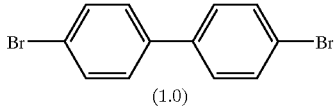 (1.0) | 90% | 6 |
| 5 | IAA-37 | 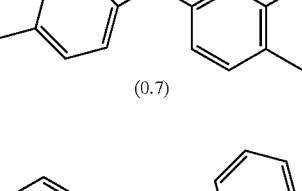 (1.05) <br> (1.05) <br> (1.05) | 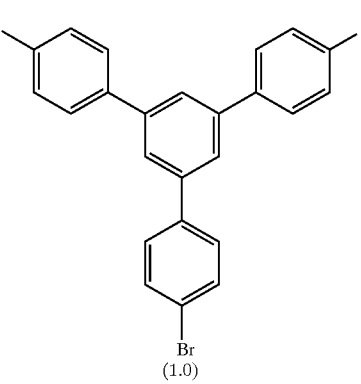 (1.0) | 84% | >6 |

TABLE 1-continued

| 6 | IAA-38 | 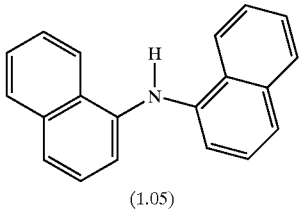 (1.05) | 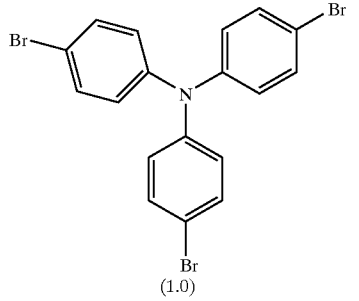 (1.0) | 82% | >6 |

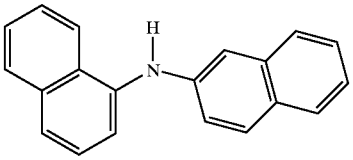
(1.05)

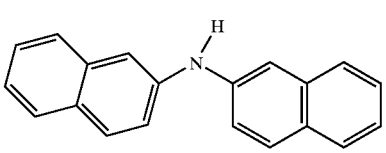
(1.05)

Fabrication of Organic EL Devices:

Examples 7–14

Organic EL devices Examples 7–14 were prepared in the following manner:
1. An indium tin oxide, 500 Angstroms in thickness, (ITO) coated glass, about 1 millimeter in thickness, was cleaned with a commercial detergent, rinsed with deionized water and dried in a vacuum oven at 60.degree. C. for 1 hour. Immediately before use, the glass was treated with UV ozone for 0.5 hour.
2. The ITO above prepared substrate was placed in a vacuum deposition chamber. The deposition rate and layer thickness were controlled by an Inficon Model IC/5 controller. Under a pressure of slightly less than about $5 \times 10^{-6}$ Torr, an aromatic amine or a mixture of isomeric aromatic amines (see examples 7 to 15) was evaporated from an electrically heated tantalum boat to deposit an 80 nanometer (800 Angstroms) hole transport layer on the ITO glass layer 1. The deposition rate of the amine compound was controlled at 0.6 nanometer/second.
3. Onto the transport layer of 2 was deposited tris(8-hydroxyquinolinate) aluminum at an evaporation rate of 0.6 nanometer/second to form an 80 nanometer electron injecting and transporting layer.
4. A 100 nanometer magnesium silver alloy was deposited at a total deposition rate of 0.5 nanometer/second onto the electron injecting and electron transporting layer of 3 by simultaneous evaporation from two independently controlled tantalum boats containing Mg and Ag, respectively. The typical composition was 9:1 in atomic ratio of Mg to Ag. Finally, a 200 nanometer silver layer was overcoated on the Mg:Ag cathode for the primary purpose of protecting the reactive Mg from ambient moisture.

The devices as prepared above were retained in a dry box which was continuously purged with nitrogen gas. The performance of the devices was assessed by measuring its current-voltage characteristics and light output under a direct current measurement. The current-voltage characteristics were determined with a Keithley Model 238 High Current Source Measure Unit. The ITO electrode was always connected to the positive terminal of the current source. At the same time, the light output from the device was monitored by a silicon photodiode.

The performance characteristics of the devices were evaluated under a constant current density of 33 mA/cm$^2$. The operation life was measured by a sustained operation time in which the light intensity reduced to a half level of the initial intensity. The initial light intensity and operation life of the devices utilizing aromatic amines or mixtures of isomeric aromatic amines are summarized in the following Table 2.

TABLE 2

Testing results of EL devices using various hole transport materials

| Example | Materials in hole transport layer | Lo cd/m$^2$ at 33 mA/cm$^2$ | Operational half life (hour) |
|---|---|---|---|
| 7 | NPB | 750 | 1850 |
| 8 | IAA-25 | 780 | 2150 |
| 9 | NPTPB | 820 | 1250 |
| 10 | IAA-28 | 850 | 1220 |
| 11 | NNB | 740 | 1980 |
| 12 | IAA-35 | 780 | 2200 |
| 13 | NPTPA | 700 | 1320 |
| 14 | IAA-38 | 720 | 1400 |

These results demonstrate that a sustained high level of light output can be achieved in the organic EL devices comprising a mixture of isomeric aromatic amines hole transport component.

Example 15

EL devices as illustrated in example 8 utilizing the mixture of isomeric aromatic amines IAA-25 as the hole transporting layer and EL device and example 7 utilizing the commonly hole transport material NPB were operated under constant current 33 mA/cm² and subjected to temperatures of 25° C., 60° C., and 85° C. for 250 hours. The changes in its current-light intensity characteristics and dark spot growth were checked. The results were list in Table 3.

TABLE 3

Temperature controlled testing results of EL devices

| EL Devices | Example 7 | | | Example 8 | | |
|---|---|---|---|---|---|---|
| | 25° C. | 60° C. | 85° C. | 25° C. | 60° C. | 85° C. |
| Light out put decay under 33 mA/cm² | 10% | 25% | 45% | 10% | 22% | 38% |
| Visual observation of dark spots growth | Not visiable | Slow growth of dark spots | Fast growth of dark spots | Not visiable | Very slow growth of dark spots | Slow growth of dark spots |

These results demonstrate that an organic EL device utilizing a mixture of isomeric aromatic amines compound as the hole transporting layer showed less changes in its current-light intensity characteristics and dark spot growth compared to an EL device utilizing a commonly used hole transport material, especially when subjected to a higher temperature operation.

Example 16

A 100 nanometer (1000 Angstroms) IAA-25 thin film on an ITO glass was prepared via thin film vaccum deposition. A comparative NPB film was prepared the same way as IAA-25. The two films were subjected to temperature of 100° C. for 50 hours. They were then cooled down to room temperature. The percentage of thin film recrystallization was checked by microscope. The results were list in Table 4.

TABLE 4

Temperature controlled testing results of single layer films

| | An 100 nanometer (1000 Angstroms) of thin film of NPB | An 100 nanometer (1000 Angstroms) of thin film of IAA-25 |
|---|---|---|
| Thin film recrystalization | 30% | 0% |

The result indicated that recrystalization of the hole transport materials in EL device at high temperature is one of the reasons causing the dark spot growth of EL devices.

Photoconductive layered devices can be prepared as illustrated herein, and more specifically, as illustrated in the relevant United States patents recited herein, and in U.S. Pat. No. 5,645,965, the disclosure of which is totally incorporated herein by reference, and wherein the starburst amine can function as the charge transport component.

Other modifications of the present invention will occur to those of ordinary skill in the art subsequent to a review of the present application. These modifications, and equivalents thereof, are intended to be included within the scope of the invention.

What is claimed is:

1. An organic electroluminescent (EL) device comprising an anode, a cathode and as a hole injection and transport layer a mixture of isomeric aromatic amine compounds consisting of the following formula:

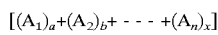

wherein:

$A_1, A_2, \ldots$ and $A_n$ represent the individual component of the mixture of isomeric aromatic amines; Each isomeric amine $A_1, A_2, \ldots$ and $A_n$ contains at least 24 carbon atoms and has a general molecular formula;

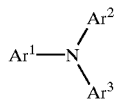

wherein:

Ar¹ is an aryl group or substituted aryl group containing at least 18 carbon atoms; Ar² and Ar³ are individual aryl groups or substituted aryl groups containing at least 6 carbon atoms;

each individual component ($A_1, A_2, \ldots$ and $A_n$) in the mixture has a same molecular formula, the difference of each individual component is the sequences of their atoms, or the point of attachment of substituents;

a, b, - - - and x are the ratio of each of die components $A_1, A_2, \ldots A_n$ in the mixture, ranging from 0 to 100%, the sum of a, b, - - - x is 1; wherein the mixture contains at least two of the following four isomeric aromatic amines:

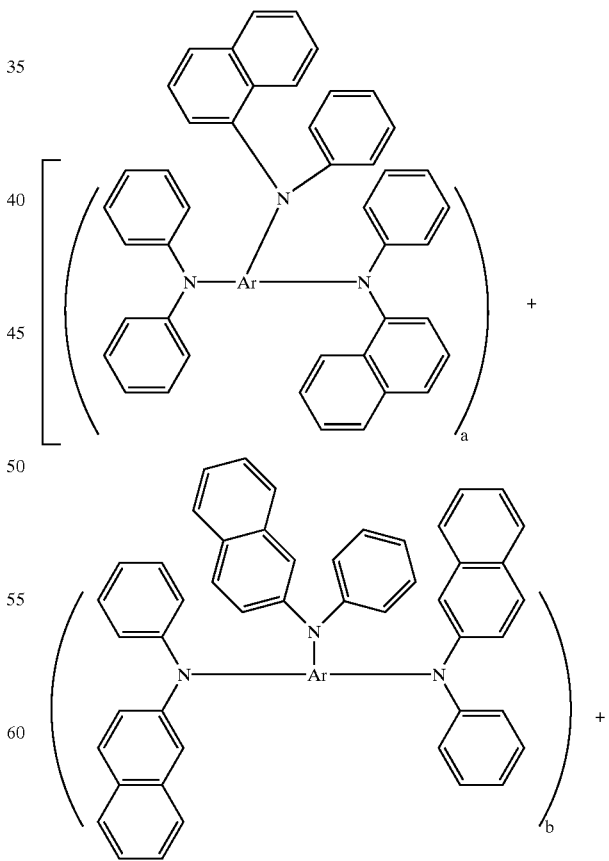

-continued

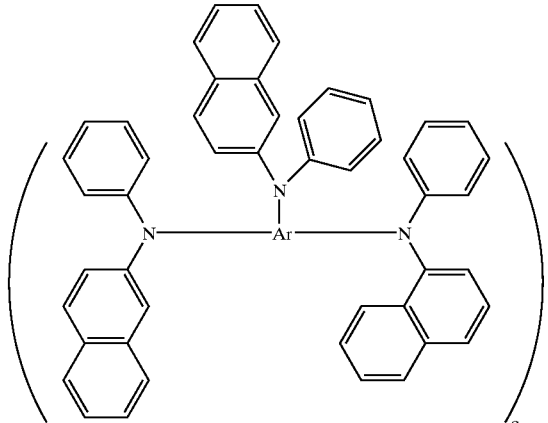

wherein:

Ar is 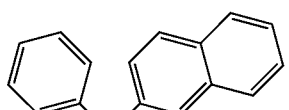 or

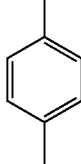

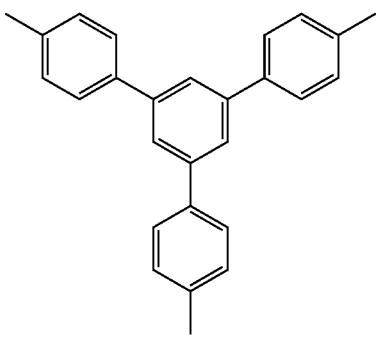

-continued

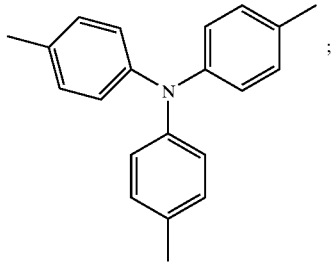

a, b, and c are the ratio of isomeric aryl amines in the mixture, ranging from 0 to 100% and the sum of a, b, and c is 1.

2. An organic electroluminescent (EL) device comprising an anode, a cathode and as a hole injection and transport layer a mixture of isomeric aromatic amine compounds consisting of the following formula:

$$[(A_1)_a + (A_2)_b + \cdots + (A_n)_x]$$

wherein:
$A_1, A_2, \ldots$ and $A_n$ represent the individual component of the mixture of isomeric aromatic amines, Each isomeric amine $A_1, A_2, \ldots$ and $A_n$ contains at least 24 carbon atoms and has a general molecular formula:

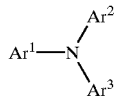

wherein:
$Ar^1$ is an aryl group or substituted aryl group containing at least 18 carbon atoms; $Ar^2$ and $Ar^3$ are individual aryl groups or substituted aryl groups containing at least 6 carbon atoms;
each individual component ($A_1, A_2, \ldots$ and $A_n$) in the mixture has a same molecular formula, the difference of each individual component is the sequences of their atoms, or the point of attachment of substituents;
a, b, and x are the ratio of each of the components $A_1, A_2, \ldots A_n$ in the mixture, ranging from 0 to 100%, the sum of a, b, - - - x is 1 wherein the mixture contains at least two of the following ten isomeric aromatic amines:

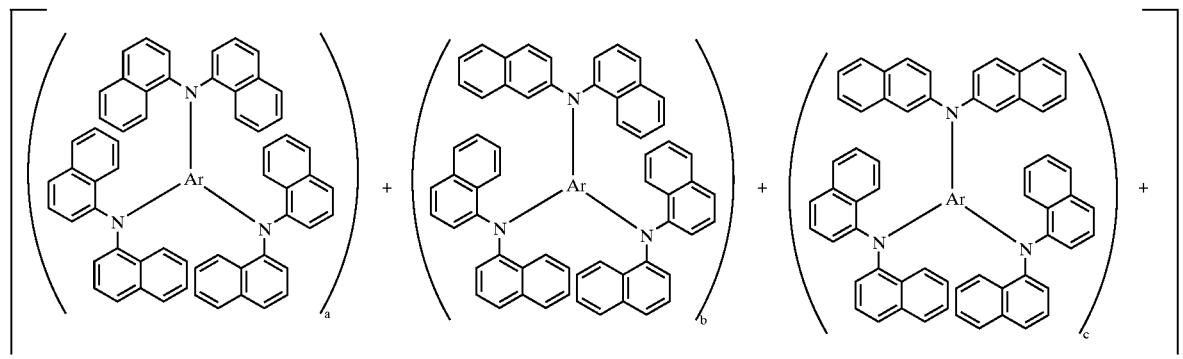

-continued

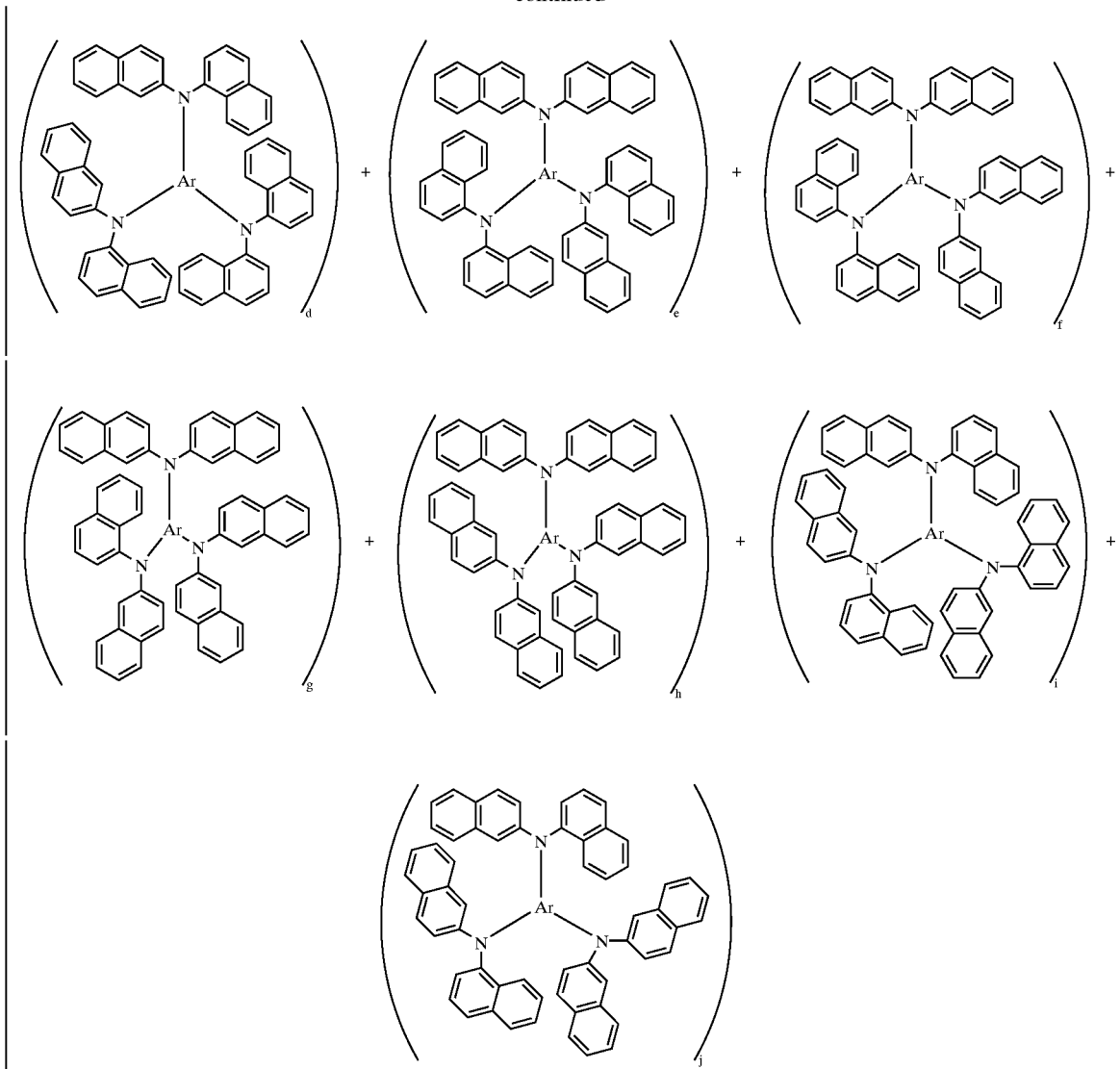

wherein:

Ar is 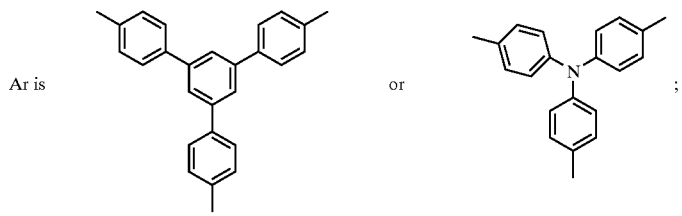 ;

a, b, c, d, e, f, g, h, i, and j are the ratio of isomeric aryl amines in the mixture, ranging from 0 to 100% and the sum of a, b, c, d, e, f, g, h, i, and j is 1.

3. An organic electroluminescent (EL) device comprising an anode, a cathode and as a hole injection and transport layer a mixture of isomeric aromatic amine compounds consisting of the following formula:

$$[(A_1)_a + (A_2)_b + \cdots (A_n)_x]$$

wherein:

$A_1, A_2, \ldots$ and $A_n$ represent the individual component of the mixture of isomeric aromatic amines; Each isomeric amine $A_1, A_2, \ldots$ and $A_n$ contains at least 24 carbon atoms and has a general molecular formula:

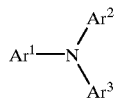

wherein:
Ar$^1$ is an aryl group or substituted aryl group containing at least 18 carbon atoms; Ar$^2$ and Ar$^3$ are individual aryl groups or substituted aryl groups containing at least 6 carbon atoms;

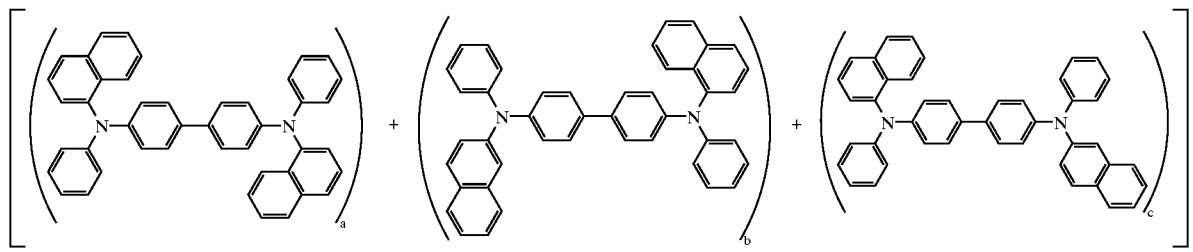

wherein:
a, b and c are the ratio of isomeric aryl amines in the mixture, The sum of a, b and c is 1 and the range of a, b and c are from 0 to 100%.

4. An organic electroluminescent (EL) device comprising an anode, a cathode and as a hole injection and transport layer a mixture of isomeric aromatic amine compounds consisting of the following formula:

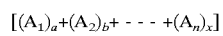

wherein:
$A_1, A_2, \text{---}$ and $A_n$ represent the individual component of the mixture of isomeric aromatic amines; Each isomeric amine $A_1, A_2, \ldots$ and $A_n$ contains at least 24 carbon atoms and has a general molecular formula each individual component ($A_1, A_2, \ldots$ and $A_n$) in the mixture has a same molecular formula, the difference of each individual component is the sequences of their atoms, or the point of attachment of substituents;

a, b, - - - and x are the ratio of each of the components $A_1, A_2, \ldots A_n$ in the mixture, ranging from 0 to 100%, the sum of a, b, - - - x is 1; wherein the mixture of isomeric aromatic amines are

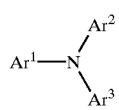

wherein:
Ar$^1$ is an aryl group or substituted aryl group containing at least 18 carbon atoms; Ar$^2$ and Ar$^3$ are individual aryl groups or substituted aryl groups containing at least 6 carbon atoms;
each individual component ($A_1, A_2, \text{---}$ and $A_n$) in the mixture has a same molecular formula, the difference of each individual component is the sequences of their atoms, or the point of attachment of substituents;
a, b, - - - and x are the ratio of each of the components $A_1, A_2, \ldots A_n$ in the mixture, ranging from 0 to 100%, the sum of a, b, - - - x is 1; wherein the mixture of isomeric aromatic amines are

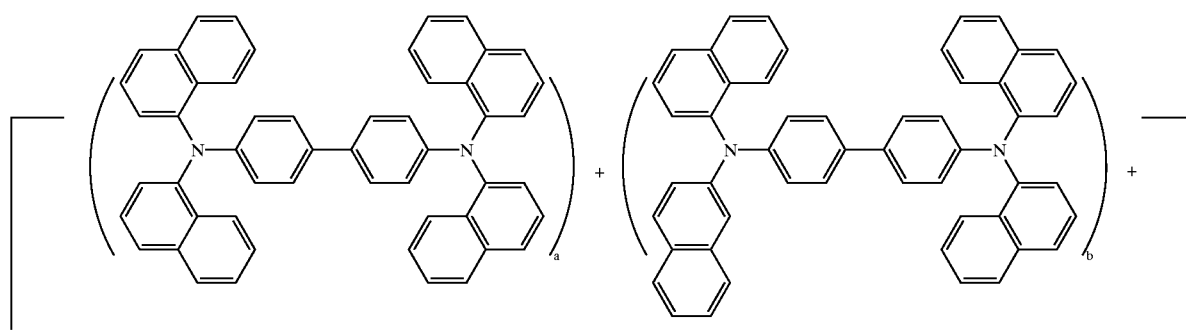

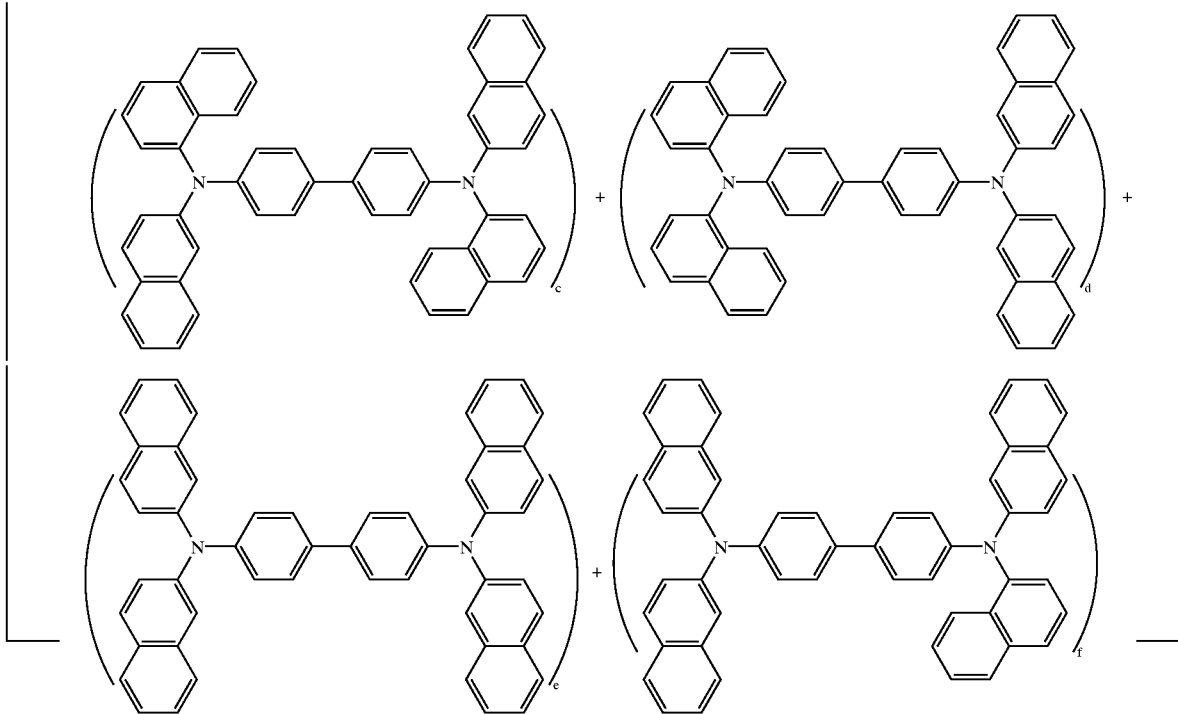

wherein:

a, b, c, d, e and f are the ratio of isomeric aryl amines in the mixture. The sum of a, b, c, d, e and f is 1 and the range of a, b, c, d, e and f are from 0 to 100%.

5. An EL device in accordance with claims 1, 2, 3, or 4 wherein the mixture of isomeric aromatic amines is presented on said anode, and on said mixture there is presented an electron injecting and electron transporting layer, and on said injecting layer said cathode is presented.

6. An EL device in accordance with claim 5 wherein the mixture of isomeric aromatic amines is presented as a layer on said anode, and on said amine layer there is presented an electron injecting and electron transporting layer, on said injecting layer said cathode is presented, and wherein said anode is presented on a supporting substrate.

7. An EL device in accordance with claim 5 wherein the device includes a substrate which is a polymer.

8. An EL device in accordance with claim 5 wherein the substrate is comprised of glass.

9. An EL device in accordance with claim 5 wherein the anode is indium tin oxide, tin oxide, gold, or platinum.

10. An EL device in accordance with claim 5 wherein the anode is a conductive carbon black.

11. An EL device in accordance with claim 5 wherein the electron injecting and electron transporting layer is comprised of anthracene, phenanthracene, pyrene, a metal thioxinoid, metal chelates of 8-hydroxyquinolinene, or perylene.

12. An EL device in accordance with claim 5 wherein the cathode is an alkaline metal an alkaline earth metal, or a rare earth metal.

13. An EL device in accordance with claim 5 wherein the cathode is lithium, magnesium, or calcium.

* * * * *